(12) United States Patent
Ikemoto et al.

(10) Patent No.: US 12,374,768 B2
(45) Date of Patent: Jul. 29, 2025

(54) SIGNAL TRANSMISSION LINE

(71) Applicant: Murata Manufacturing Co., Ltd., Nagaokakyo (JP)

(72) Inventors: Nobuo Ikemoto, Nagaokakyo (JP); Kanto Iida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 513 days.

(21) Appl. No.: 17/959,333

(22) Filed: Oct. 4, 2022

(65) Prior Publication Data
US 2023/0022402 A1 Jan. 26, 2023

Related U.S. Application Data

(63) Continuation of application No. PCT/JP2021/014114, filed on Apr. 1, 2021.

(30) Foreign Application Priority Data

Apr. 24, 2020 (JP) .................................. 2020-077161

(51) Int. Cl.
| | |
|---|---|
| *H01P 3/08* | (2006.01) |
| *H01P 1/02* | (2006.01) |
| *H04M 1/02* | (2006.01) |
| *H05K 1/02* | (2006.01) |

(52) U.S. Cl.
CPC ................ *H01P 3/08* (2013.01); *H01P 1/022* (2013.01); *H04M 1/026* (2013.01); *H05K 1/0242* (2013.01)

(58) Field of Classification Search
CPC .......... H01P 3/08; H01P 1/022; H04M 1/026; H05K 1/0242
See application file for complete search history.

(56) References Cited

U.S. PATENT DOCUMENTS

| 5,724,012 A | 3/1998 | Teunisse |
| 2003/0214802 A1 | 11/2003 | Fjelstad et al. |
| 2009/0133906 A1* | 5/2009 | Baek .................... H05K 1/0218 29/830 |
| 2015/0137912 A1 | 5/2015 | Nagel et al. |

(Continued)

FOREIGN PATENT DOCUMENTS

| JP | 2005303778 A | 10/2005 |
| JP | 2015104131 A | 6/2015 |

(Continued)

OTHER PUBLICATIONS

International Search Report in PCT/JP2021/014114, mailed Jun. 22, 2021, 3 pages.

*Primary Examiner* — Samuel S Outten
(74) *Attorney, Agent, or Firm* — Keating & Bennett, LLP

(57) ABSTRACT

A signal transmission line includes a signal region that includes a signal conductor layer and insulating base material layers, and a first ground region that includes a first ground conductor layer and insulating base material layers and is located above the signal region. The signal region is not fixed to the first ground region in a first section of a base. One or more first spacers are fixed to the signal region and in contact with the first ground region without being fixed thereto, or are in contact with the signal region without being fixed thereto and fixed to the first ground region. The one or more first spacers are in the first section.

20 Claims, 13 Drawing Sheets

(56) References Cited

U.S. PATENT DOCUMENTS

2015/0305142 A1* 10/2015 Matsuda .............. H05K 3/0052
　　　　　　　　　　　　　　　　　　　　　　29/601
2018/0309182 A1　　10/2018 Iida et al.
2021/0242554 A1*　8/2021 Kim ........................ H01P 3/082

FOREIGN PATENT DOCUMENTS

| JP | 2017123404 A | 7/2017 |
| WO | 2017130731 A1 | 8/2017 |

* cited by examiner

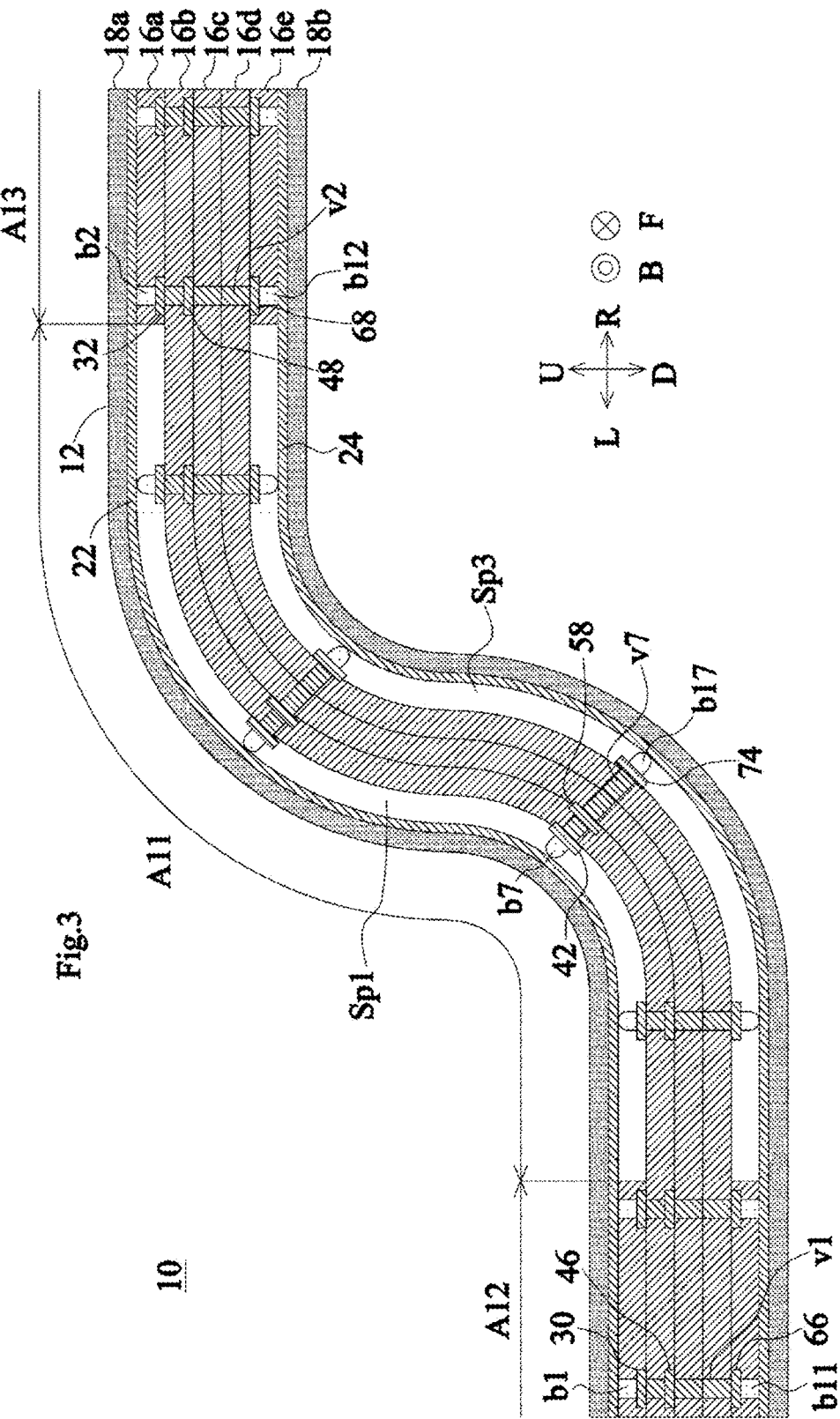

Fig. 4A
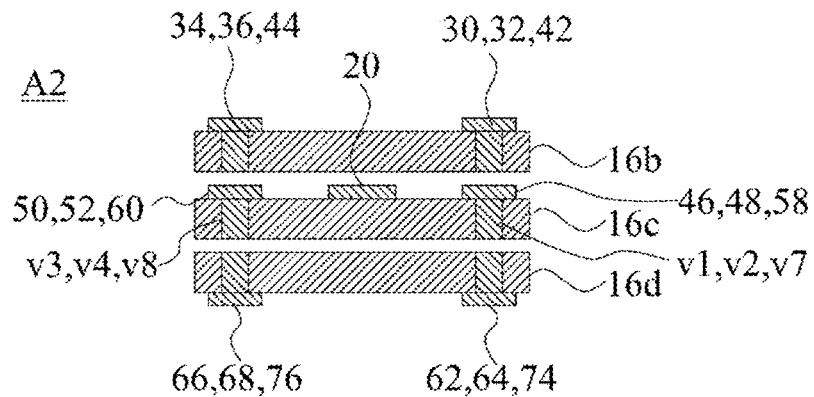
Fig. 4B
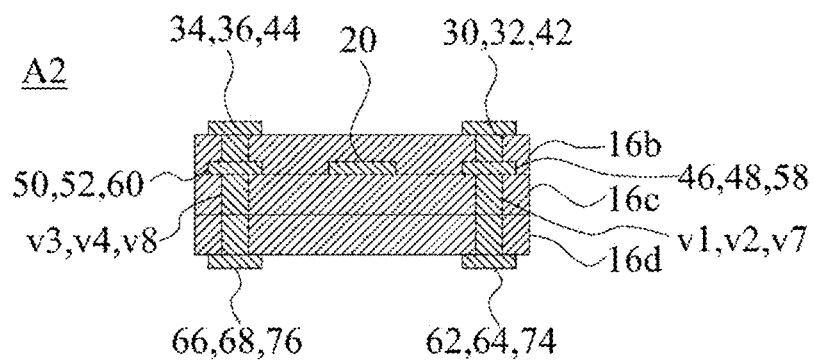
Fig. 4C
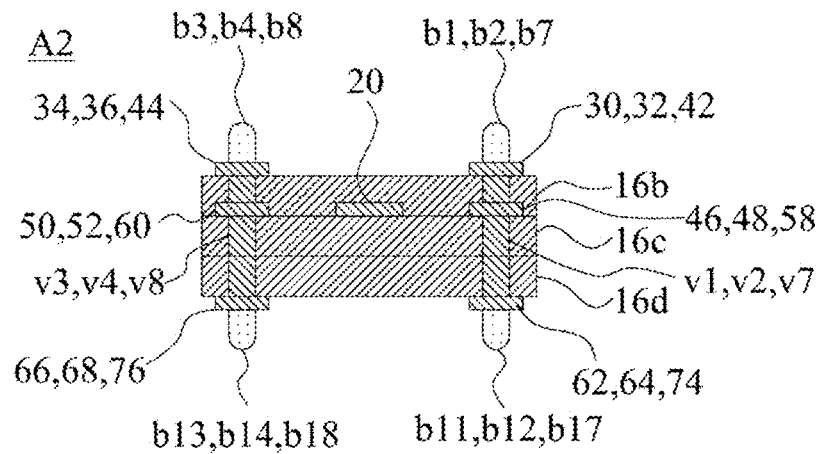
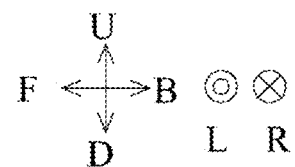

Fig. 5A
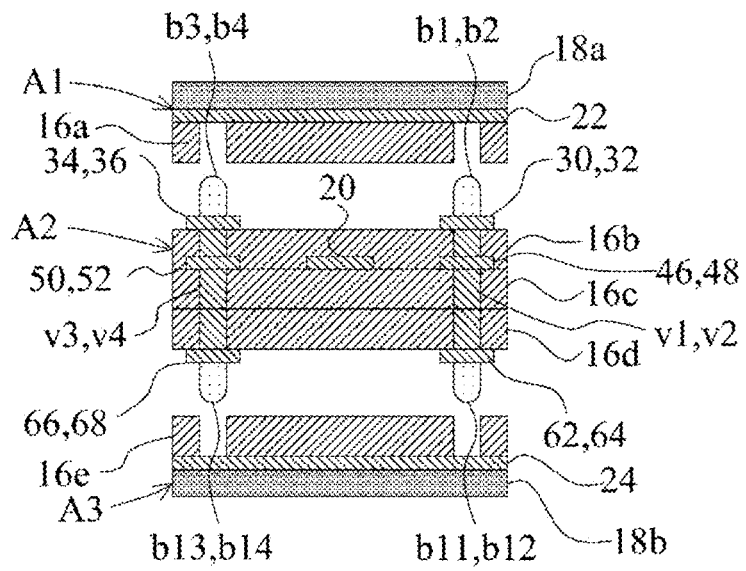
Fig. 5B
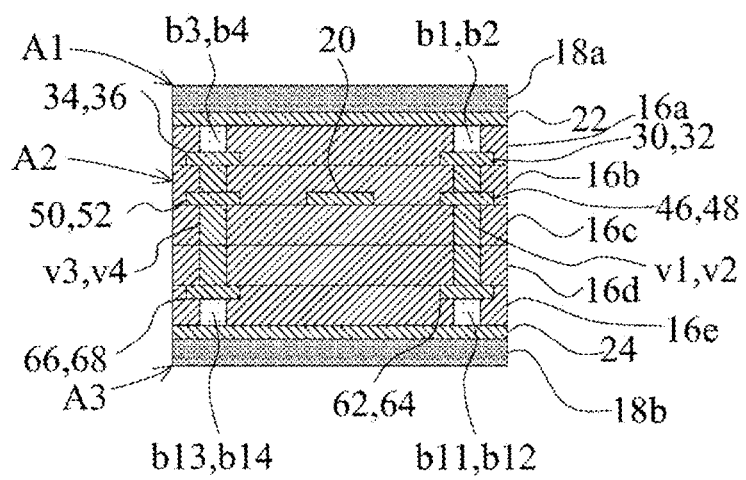
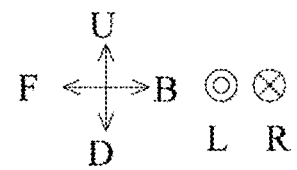

Fig. 6A
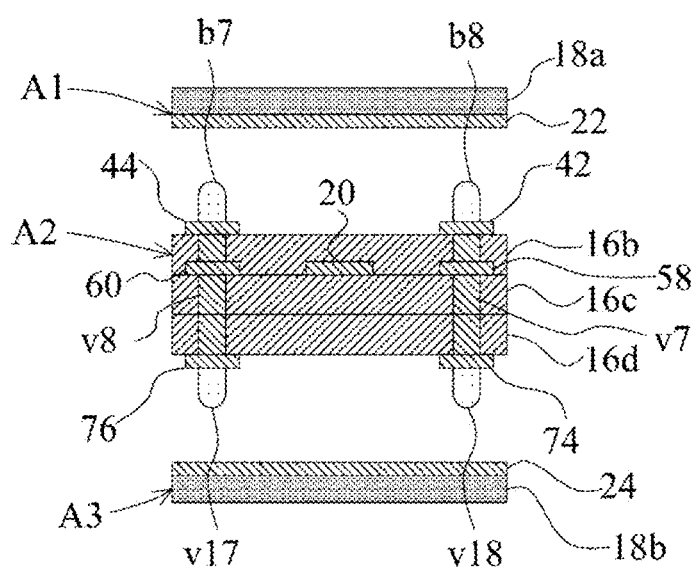
Fig. 6B
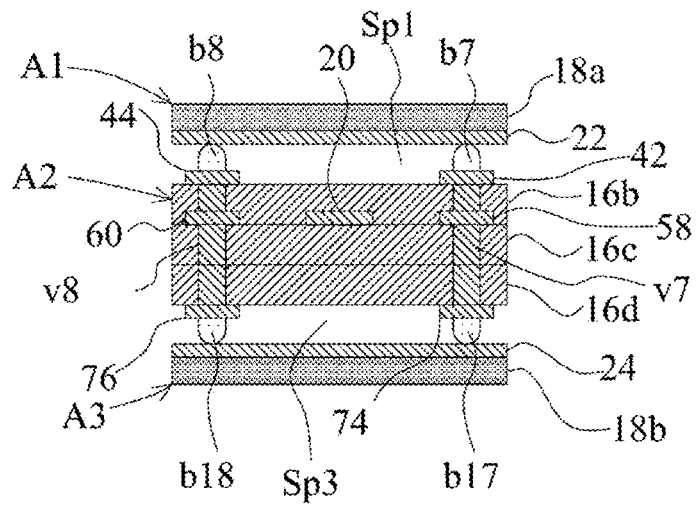
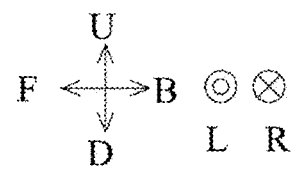

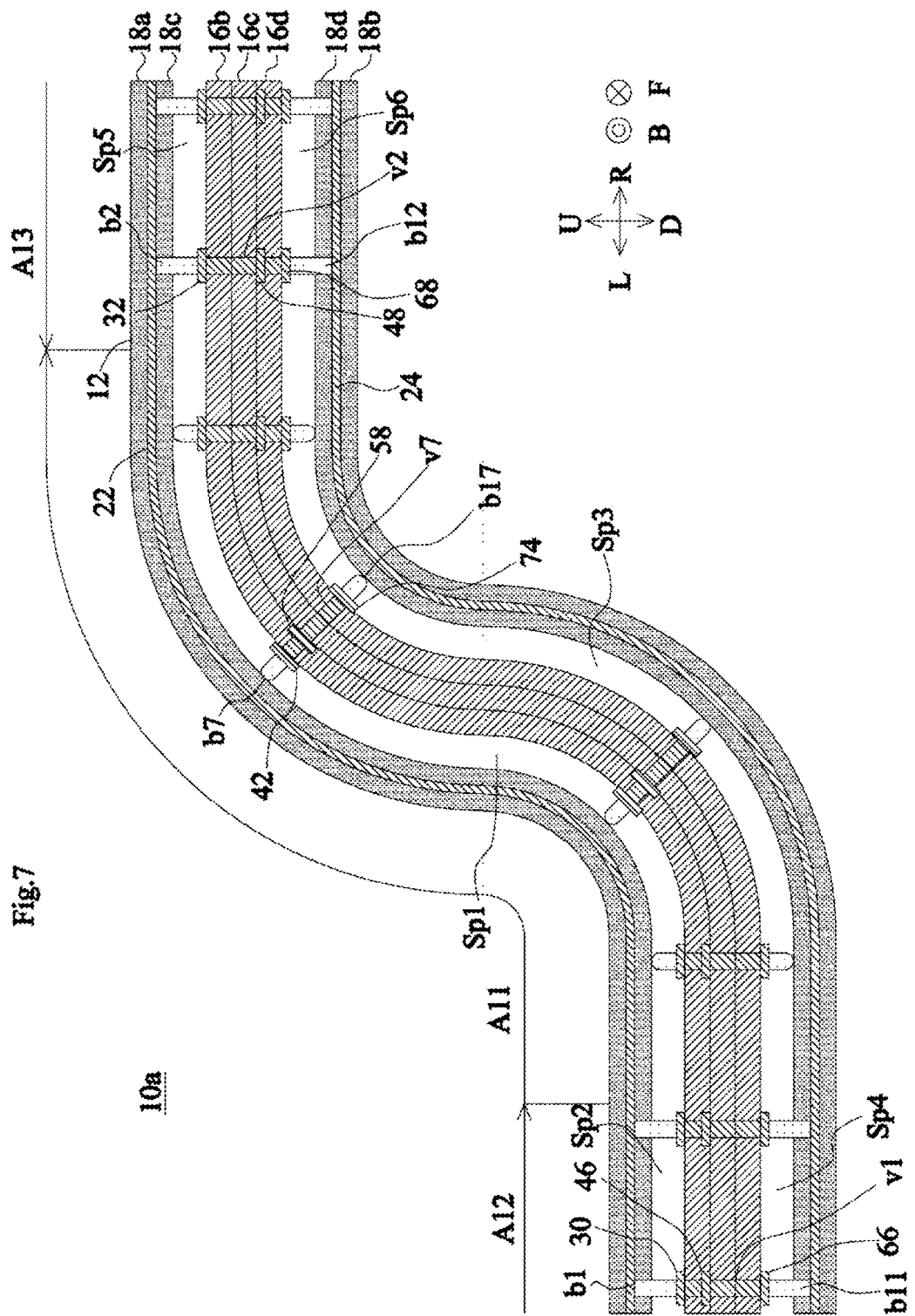

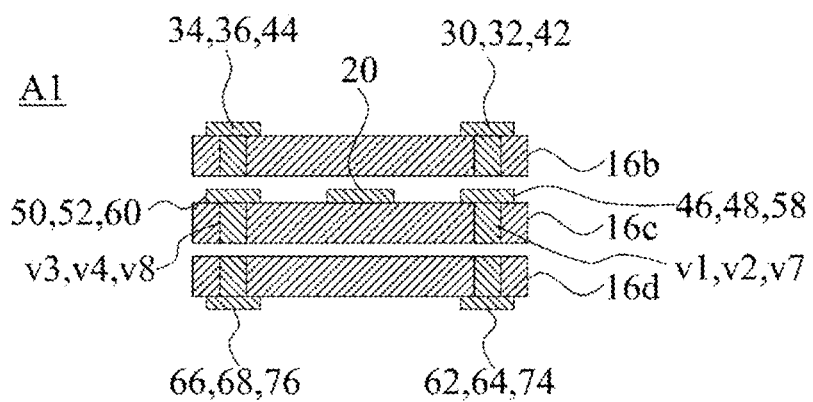
Fig. 9A
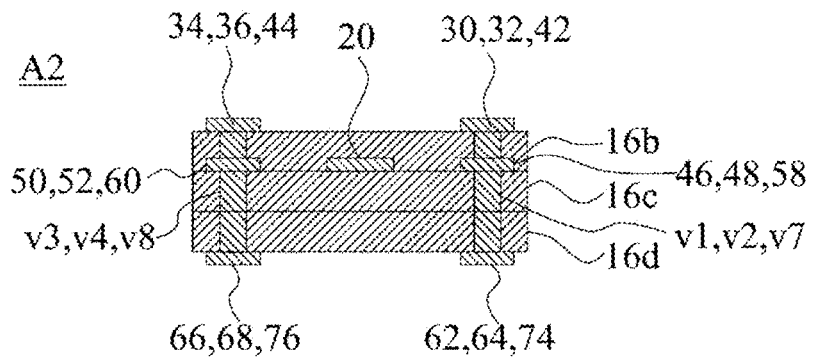
Fig. 9B
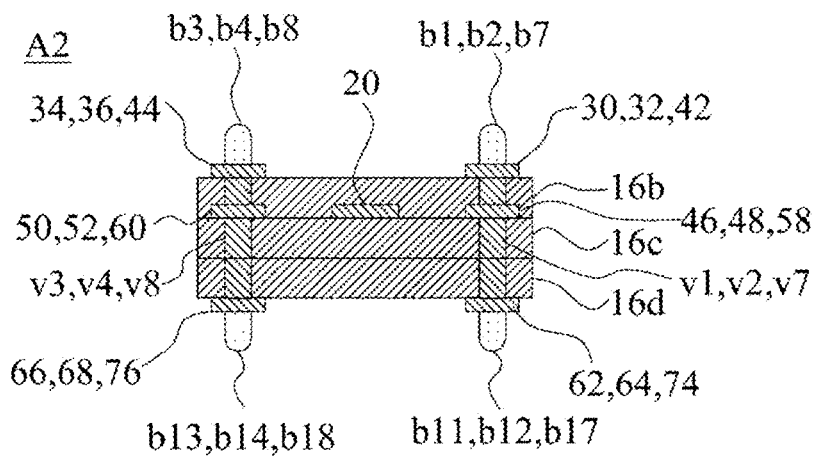
Fig. 9C
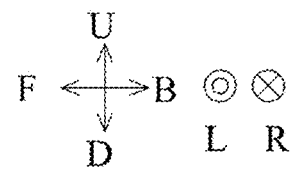

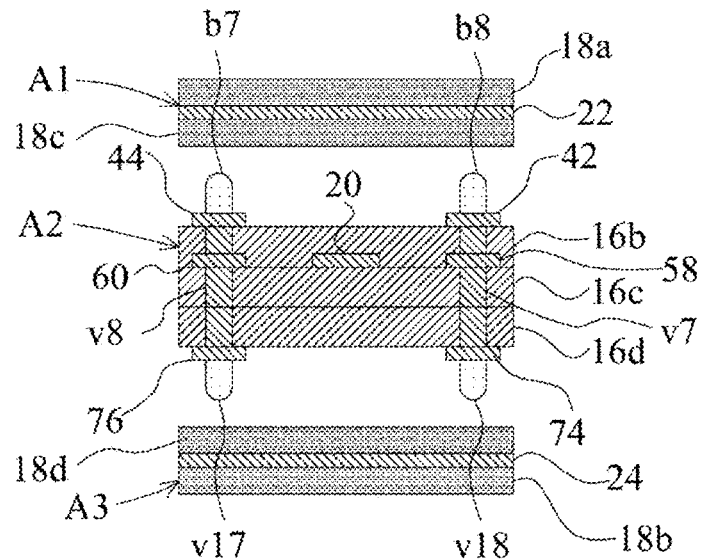
Fig. 11A
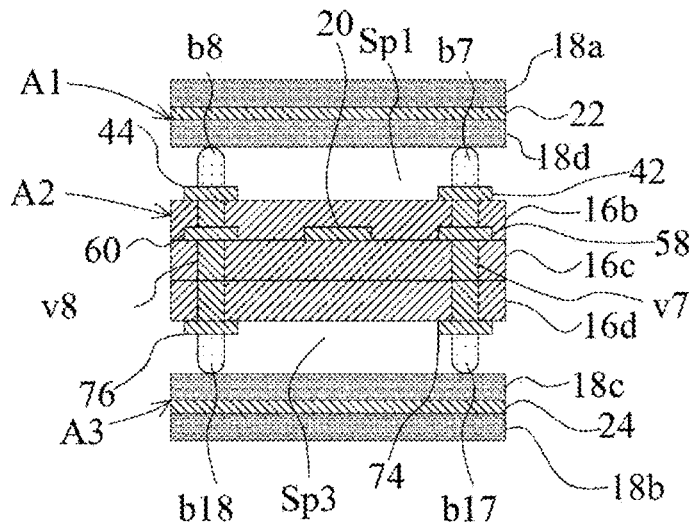
Fig. 11B
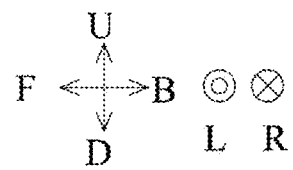

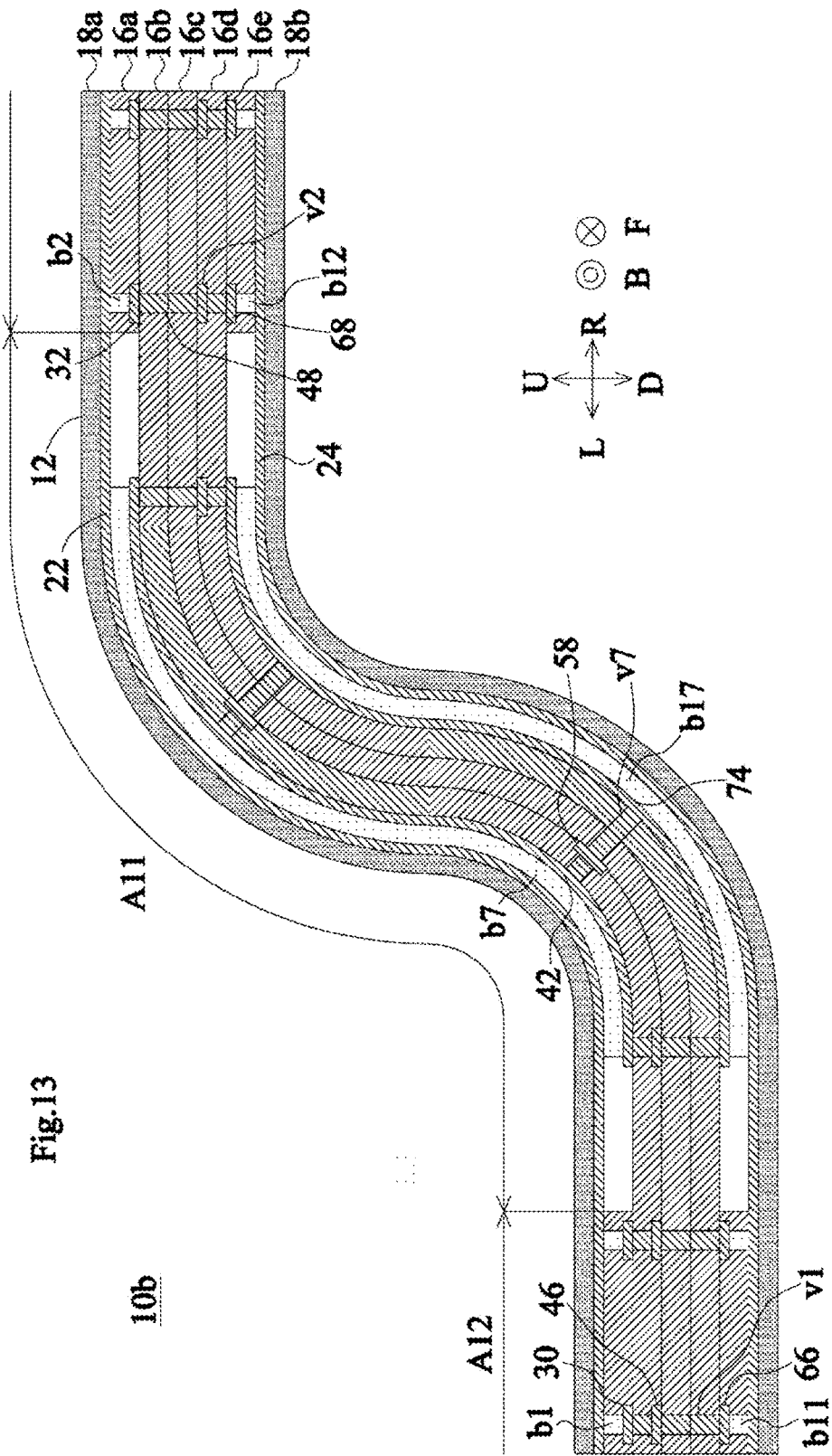

SIGNAL TRANSMISSION LINE

CROSS REFERENCE TO RELATED APPLICATIONS

This application claims the benefit of priority to Japanese Patent Application No. 2020-077161 filed on Apr. 24, 2020 and is a Continuation Application of PCT Application No. PCT/JP2021/014114 filed on Apr. 1, 2021. The entire contents of each application are hereby incorporated herein by reference.

BACKGROUND OF THE INVENTION

1. Field of the Invention

The present invention relates to a signal transmission line including a signal conductor layer and ground conductor layers.

2. Description of the Related Art

As a related-art invention relating to a signal transmission line, for example, a signal transmission line described in International Publication No. 2017/130731 has been known. The signal transmission line described in International Publication No. 2017/130731 includes a multilayer body, a signal conductor, a first ground conductor, and a second ground conductor. The multilayer body has a structure in which a plurality of resin sheets are laminated in the up and down direction. The multilayer body is flexible. The signal conductor, the first ground conductor, and the second ground conductor are provided in the multilayer body. The first ground conductor is disposed above the signal conductor. The second ground conductor is disposed under the signal conductor. With this, the signal conductor, the first ground conductor, and the second ground conductor have a stripline structure. Further, in the multilayer body, a gap is formed between the first ground conductor and the signal conductor. In a similar manner, in the multilayer body, a gap is formed between the second ground conductor and the signal conductor. With this, the occurrence of dielectric loss is prevented in the signal transmission line described in International Publication No. 2017/130731. Such a signal transmission line described in International Publication No. 2017/130731 is bent in the up and down direction in use.

SUMMARY OF THE INVENTION

Incidentally, when the signal transmission line described in International Publication No. 2017/130731 is bent in the up and down direction, the characteristic impedance of the signal transmission line is changed. Now, a case where the signal transmission line is bent so that the second ground conductor is located on the inner side of the first ground conductor is described as an example. When the signal transmission line is bent, tensile stress and compressive stress are generated in the resin sheets. In particular, compressive stress is generated in the resin sheets located on the inner side of the signal conductor. Such compressive stress tends to be concentrated on a portion of the resin sheets located on the inner side of the signal conductor. Thus, the resin sheets located on the inner side of the signal conductor are deformed to be bent in part. As a result, the interval between the signal conductor and the second ground conductor is changed. The capacitance value between the signal conductor and the second ground conductor is changed. As a result, the characteristic impedance of the signal transmission line is changed. Note that although a detailed description is omitted, the resin sheets located on the outer side of the signal conductor are also deformed so that the capacitance value between the signal conductor and the first ground conductor is changed.

Preferred embodiments of the present invention provide signal transmission lines that each prevent a change in characteristic impedance of the signal transmission line, even when a base material is bent in the up and down direction.

A signal transmission line according to an aspect of a preferred embodiment of the present invention includes a base including a plurality of insulating base material layers laminated in an up and down direction and a first section that is bent in the up and down direction, a signal conductor layer in the base, a first ground conductor layer in the base and above the signal conductor layer so as to be overlapped with the signal conductor layer as viewed in a downward direction, and one or more first spacers, wherein the signal transmission line includes a signal region that includes the signal conductor layer and some of the plurality of insulating base material layers, and a first ground region that includes the first ground conductor layer and some of the plurality of insulating base material layers and is located above the signal region, the signal region is not fixed to the first ground region in the first section of the base, the one or more first spacers are fixed to the signal region and in contact with the first ground region without being fixed thereto, or are in contact with the signal region without being fixed thereto and fixed to the first ground region, and the one or more first spacers are in the first section.

Now, the definitions of terms used herein are described. Herein, a shaft or a member that extends in the front and back direction does not necessarily indicate a shaft or a member in parallel with the front and back direction. A shaft or a member that extends in the front and back direction includes a shaft or a member that is inclined from the front and back direction at an angle within about ±45°. In a similar manner, a shaft or a member that extends in the up and down direction includes a shaft or a member that is inclined from the up and down direction at an angle within about ±45°. A shaft or a member that extends in the left and right direction includes a shaft or a member that is inclined from the left and right direction at an angle within about ±45°.

In the following, a first member to a third member refer to components of a signal transmission line. Herein, unless otherwise particularly stated, each portion of the first member is defined as follows. The front portion of the first member refers to the front half of the first member. The back portion of the first member refers to the back half of the first member. The left portion of the first member refers to the left half of the first member. The right portion of the first member refers to the right half of the first member. The upper portion of the first member refers to the upper half of the first member. The lower portion of the first member refers to the lower half of the first member. The front end of the first member refers to the end in the frontward direction of the first member. The back end of the first member refers to the end in the backward direction of the first member. The left end of the first member refers to the end in the leftward direction of the first member. The right end of the first member refers to the end in the rightward direction of the first member. The upper end of the first member refers to the end in the upward direction of the first member. The lower end of the first member refers to the end in the downward direction of the first member. The front end portion of the first member refers to the front end and vicinity thereof of the first member. The back end portion of the first member refers to the back end and vicinity thereof of the first member. The left end portion of the first member refers to the left end and vicinity thereof of the first member. The right end portion of the first member refers to the right end and vicinity thereof of the first member. The upper end portion of the first member refers to the upper end and vicinity thereof of the first member. The lower end portion of the first member refers to the lower end and vicinity thereof of the first member.

When any two of members referred to herein are defined as the first member and the second member, the two optionally determined members have the following relationship. Herein, the expression "the first member is supported by the second member" includes a case where the first member is mounted on the second member to be unmovable relative to the second member (that is, fixed) and a case where the first member is mounted on the second member to be movable relative to the second member. Further, the expression "the first member is supported by the second member" includes both of a case where the first member is directly mounted on the second member and a case where the first member is mounted on the second member with the third member interposed therebetween.

Herein, the expression "the first member is fixed to the second member" includes a case where the first member is mounted on the second member to be unmovable relative to the second member and does not include a case where the first member is mounted on the second member to be movable relative to the second member. Further, the expression "the first member is fixed to the second member" includes both of a case where the first member is directly mounted on the second member and a case where the first member is mounted on the second member with the third member interposed therebetween.

Herein, the expression "the first member and the second member are electrically connected to each other" indicates that electricity is conducted between the first member and the second member. Thus, the first member and the second member may be in contact with each other but the first member and the second member are not necessarily in contact with each other. When the first member and the second member are not in contact with each other, the conductive third member is disposed between the first member and the second member.

With the signal transmission lines according to preferred embodiment of the present invention, it is possible to prevent a change in characteristic impedance of the signal transmission line, even when the base material is bent in the up and down direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a sectional view taken along the line A-A of FIG. 1.

FIGS. 4A to 4C are sectional views of the manufacturing processes of the signal transmission line 10.

FIGS. 5A and 5B are sectional views of the manufacturing processes of the signal transmission line 10.

FIGS. 6A and 6B are sectional views of the manufacturing processes of the signal transmission line 10.

FIG. 7 is a sectional view taken along the line A-A of FIG. 1.

FIG. 8 is an exploded perspective view of the signal transmission line 10a.

FIGS. 9A to 9C are sectional views of the manufacturing processes of the signal transmission line 10a.

FIGS. 10A to 10B are sectional views of the manufacturing processes of the signal transmission line 10a.

FIGS. 11A and 11B are sectional views of the manufacturing processes of the signal transmission line 10a.

FIG. 13 is a sectional view taken along the line A-A of FIG. 1.

DETAILED DESCRIPTION OF THE PREFERRED EMBODIMENTS

Preferred Embodiment

Structure of Signal Transmission Line

Figure 1:
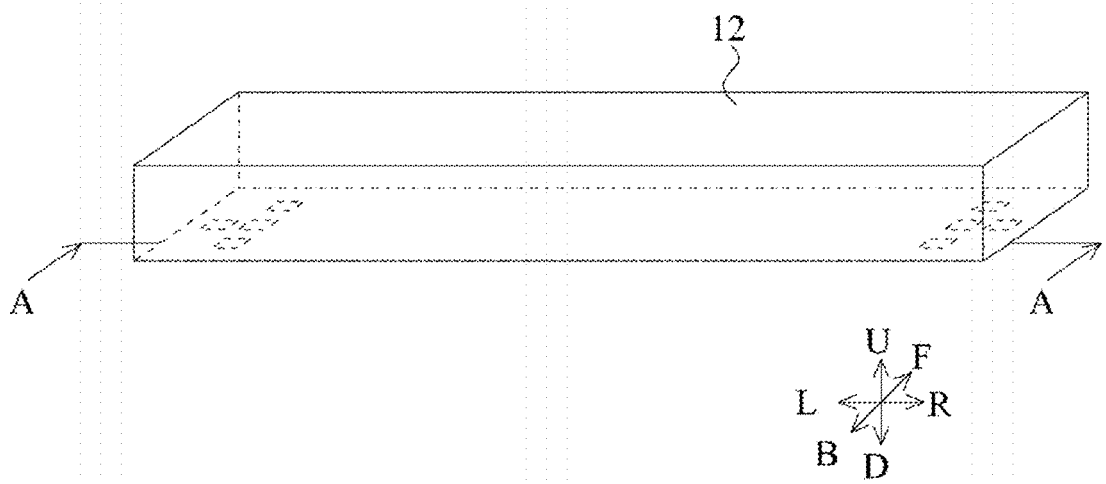
FIG. 1 is an external perspective view of signal transmission lines 10, 10a, and 10b.
Figure 2:
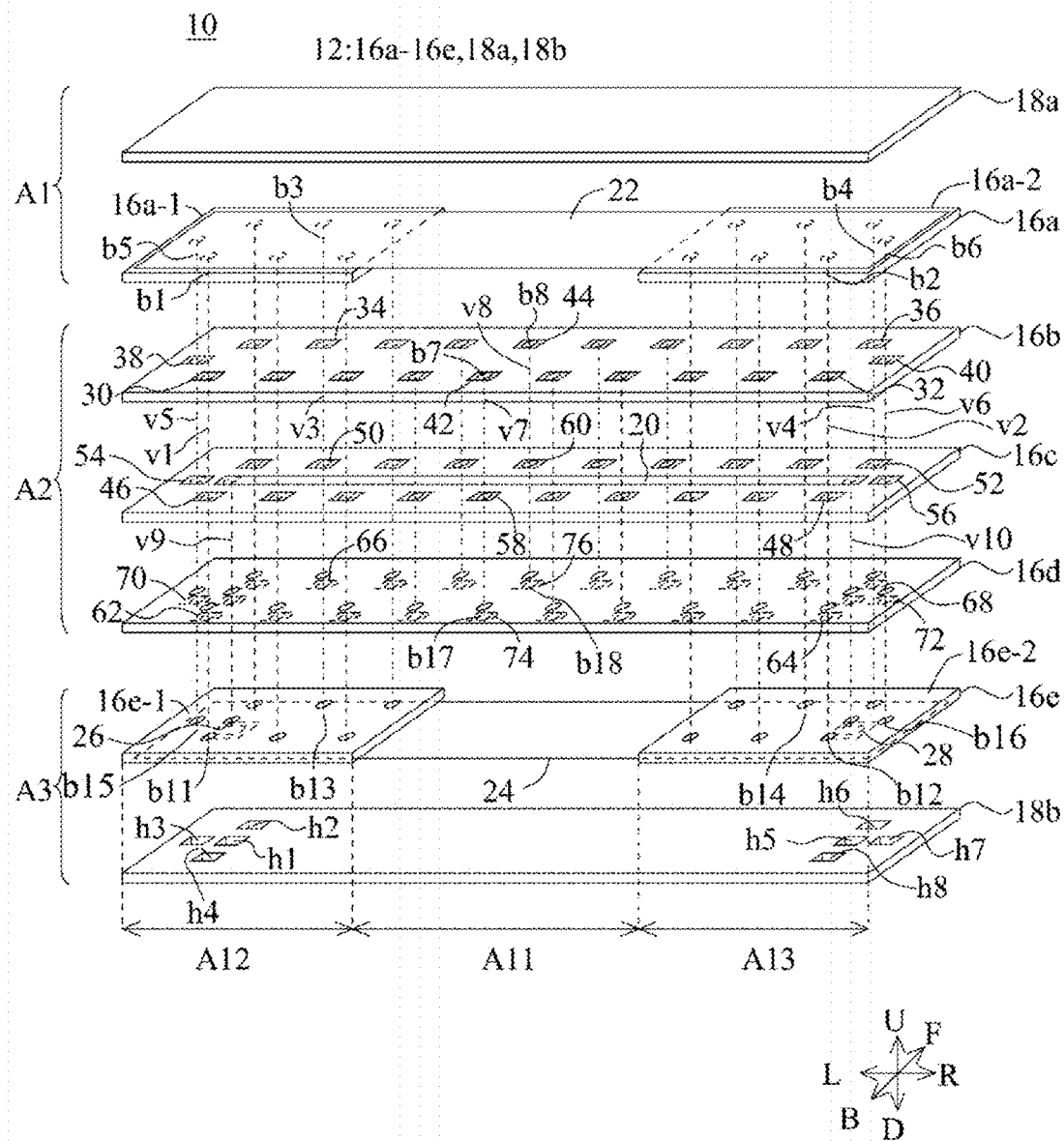
FIG. 2 is an exploded perspective view of the signal transmission line 10.

Now, the structure of a signal transmission line 10 according to a preferred embodiment of the present invention is described with reference to the drawings. FIG. 1 is an external perspective view of signal transmission lines 10, 10a, and 10b. FIG. 2 is an exploded perspective view of the signal transmission line 10. FIG. 3 is a sectional view taken along the line A-A of FIG. 1.

Further, herein, directions are defined as follows. The laminating direction of a base 12 of the signal transmission line is defined as the up and down direction. The longitudinal direction of the base 12 is defined as the left and right direction. The transverse direction of the base 12 is defined as the front and back direction. The up and down direction, the left and right direction, and the front and back direction are orthogonal to each other. Note that the definitions of the directions herein are examples. Thus, directions when the signal transmission line 10 is actually used and the directions herein are not necessarily matched with each other.

The signal transmission line 10 is used to connect two circuit boards in an electronic device such as a mobile phone, for example. As illustrated in FIG. 1 and FIG. 2, the signal transmission line 10 includes the base 12, a signal conductor layer 20, a first ground conductor layer 22, a second ground conductor layer 24, outer electrodes 26 and 28, a plurality of second spacers b1 to b6, a plurality of first spacers b7 and b8, a plurality of fourth spacers b11 to b16, a plurality of third spacers b17 and b18, a plurality of via hole conductors v1 to v10, and a plurality of connection conductor layers 30, 32, 34, 36, 38, 40, 42, 44, 46, 48, 50, 52, 54, 56, 58, 60, 62, 64, 66, 68, 70, 72, 74, and 76.

Note that, as seen in FIGS. 2 and 3, the representative spacers, via hole conductors, and connection conductor layers of the plurality of second spacers b1 to b6, the plurality of first spacers b7 and b8, the plurality of fourth spacers b11 to b16, the plurality of third spacers b17 and b18, the plurality of via hole conductors v1 to v8, and the plurality of connection conductor layers 30, 32, 34, 36, 38, 40, 42, 44, 46, 48, 50, 52, 54, 56, 58, 60, 62, 64, 66, 68, 70, 72, 74, and 76 are denoted by the reference characters.

The base 12 has a plate shape. As illustrated in FIG. 1, the base 12 has a rectangular shape with the long side extending in the left and right direction as viewed in the downward direction. Thus, the length in the left and right direction of the base 12 is longer than the length in the front and back direction of the base 12. The length in the front and back direction of the base 12 is longer than the length in the up and down direction of the base 12. The base 12 is flexible. Thus, the base 12 is bent in the up and down direction in use in the electronic device. Thus, as illustrated in FIG. 2 and FIG. 3, the base 12 has a first section A11 and second sections A12 and A13. The first section A11 is a section that is bent in the up and down direction. The second sections A12 and A13 are sections that are not bent in the up and down direction. That is, the second sections A12 and A13 have a radius of curvature larger than the radius of curvature of the first section A11. The second section A12 is located on the left side of the first section A11. The second section A12 is adjacent to the first section A11. The second section A13 is located on the right side of the first section A11. The second section A13 is adjacent to the first section A11.

The base 12 has a structure in which a plurality of insulating base material layers 16a to 16e, 18a, and 18b are laminated in the up and down direction. The insulating base material layers 18a, 16a to 16e, and 18b are laminated from top to bottom in this order. The insulating base material layers 16a to 16e are flexible dielectric sheets. The material of the insulating base material layers 16a to 16e is a thermoplastic resin such as a polyimide or a liquid crystal polymer. The insulating base material layers 16b to 16d have the same rectangular shape as the base 12 as viewed in the downward direction.

The insulating base material layer 16a is isolated into an insulating base material layer left portion 16a-1 and an insulating base material layer right portion 16a-2. The insulating base material layer left portion 16a-1 and the insulating base material layer right portion 16a-2 have a rectangular shape with the long side extending in the left and right direction as viewed in the downward direction. The insulating base material layer left portion 16a-1 and the insulating base material layer right portion 16a-2 are arranged from left to right in this order. The insulating base material layer left portion 16a-1 is disposed in the second section A12. The insulating base material layer right portion 16a-2 is disposed in the second section A13. The insulating base material layer left portion 16a-1 and the insulating base material layer right portion 16a-2 are disposed apart from each other in the left and right direction. Thus, the insulating base material layer 16a is not disposed in the first section A11.

The insulating base material layer 16e is divided into an insulating base material layer left portion 16e-1 and an insulating base material layer right portion 16e-2. The insulating base material layer left portion 16e-1 and the insulating base material layer right portion 16e-2 have a rectangular shape with the long side extending in the left and right direction as viewed in the downward direction. The insulating base material layer left portion 16e-1 and the insulating base material layer right portion 16e-2 are arranged from left to right in this order. The insulating base material layer left portion 16e-1 is disposed in the second section A12. The insulating base material layer right portion 16e-2 is disposed in the second section A13. The insulating base material layer left portion 16e-1 and the insulating base material layer right portion 16e-2 are spaced apart from each other in the left and right direction. Thus, the insulating base material layer 16e is not disposed in the first section A11.

The signal conductor layer 20 is provided in the base 12. More specifically, the signal conductor layer 20 is provided on the upper surface of the insulating base material layer 16c. With this, the signal conductor layer 20 is provided inside the base 12. As illustrated in FIG. 2, the signal conductor layer 20 has a linear shape extending in the left and right direction. The signal conductor layer 20 is disposed at the center in the front and back direction of the upper surface of the insulating base material layer 16c. The left end of the signal conductor layer 20 is located at the left end portion of the insulating base material layer 16c. The right end of the signal conductor layer 20 is located at the right end portion of the insulating base material layer 16c. A high-frequency signal is transmitted to the signal conductor layer 20.

The first ground conductor layer 22 is provided in the base 12. The first ground conductor layer 22 is disposed above the signal conductor layer 20 so as to be overlapped with the signal conductor layer 20 as viewed in the downward direction. Herein, the expression "the first ground conductor layer 22 is disposed above the signal conductor layer 20" indicates the following state. At least a portion of the first ground conductor layer 22 is disposed in a region through which the signal conductor layer 20 passes when translating upward. Thus, the first ground conductor layer 22 may fit within the region through which the signal conductor layer 20 passes when translating upward or may protrude from the region through which the signal conductor layer passes when translating upward. In the present preferred embodiment, the first ground conductor layer 22 protrudes from the region through which the signal conductor layer 20 passes when translating upward.

The first ground conductor layer 22 is provided on the upper surface of the insulating base material layer 16a. However, the first ground conductor layer 22 is also provided in the section between the insulating base material layer left portion 16a-1 and the insulating base material layer right portion 16a-2 (that is, the first section A11). The first ground conductor layer 22 extends along the lower surface of the insulating base material layer 18a, which is described later, in the left and right direction in the first section A11. With this, the first ground conductor layer 22 is provided inside the base 12. As illustrated in FIG. 2, the first ground conductor layer 22 has a rectangular shape with the long side extending in the left and right direction as viewed in the downward direction. The shape of the first ground conductor layer 22 is substantially matched with that of the base 12 as viewed in the downward direction. However, the first ground conductor layer 22 is slightly smaller than the base 12 as viewed in the downward direction. A ground potential is connected to the first ground conductor layer 22.

The second ground conductor layer 24 is provided in the base 12. The second ground conductor layer 24 is disposed under the signal conductor layer 20 so as to be overlapped with the signal conductor layer 20 as viewed in the downward direction. More specifically, the second ground conductor layer 24 is provided on the lower surface of the insulating base material layer 16e. However, the second ground conductor layer 24 is also provided in the section between the insulating base material layer left portion 16e-1 and the insulating base material layer right portion 16e-2 (that is, the first section A11). The second ground conductor layer 24 extends along the upper surface of the insulating base material layer 18b, which is described later, in the left and right direction in the first section A11. With this, the second ground conductor layer 24 is provided inside the base 12. As illustrated in FIG. 2, the second ground conductor layer 24 has a rectangular shape with the long side extending in the left and right direction as viewed in the downward direction. The shape of the second ground conductor layer 24 is substantially matched with that of the base 12 as viewed in the downward direction. However, the second ground conductor layer 24 is slightly smaller than the base 12 as viewed in the downward direction. The ground potential is connected to the second ground conductor layer 24. The signal conductor layer 20, the first ground conductor layer 22, and the second ground conductor layer 24 as described above have a stripline structure.

The outer electrode 26 is provided on the lower surface of the insulating base material layer left portion 16e-1. The outer electrode 26 has a rectangular shape as viewed in the downward direction. The second ground conductor layer 24 is not provided around the outer electrode 26 so that the outer electrode 26 is insulated from the first ground conductor layer 22. The outer electrode 26 is overlapped with the left end portion of the signal conductor layer 20 as viewed in the downward direction. The outer electrode 26 is electrically connected to the central conductor of a first connector, which is not illustrated. With this, a high-frequency signal is input to or output from the signal conductor layer 20 through the outer electrode 26. The structure of the outer electrode 28 is symmetrical to that of the outer electrode 26 with respect to the vertical line. Thus, the description of the outer electrode 28 is omitted.

The insulating base material layers 18a and 18b are flexible resist layers. The insulating base material layers 18a and 18b have the same rectangular shape as the base 12 as viewed in the downward direction. The insulating base material layer 18a covers the entire upper surface of the insulating base material layer 16a. With this, the insulating base material layer 18a protects the first ground conductor layer 22.

The insulating base material layer 18b substantially covers the entire lower surface of the insulating base material layer 16e. With this, the insulating base material layer 18b protects the second ground conductor layer 24. However, the insulating base material layer 18b has openings h1 to h8. The opening h1 is overlapped with the outer electrode 26 as viewed in the downward direction. With this, the outer electrode 26 is exposed from the signal transmission line 10 to the outside through the opening h1. The opening h2 is on the front side of the opening h1. The opening h3 is on the left side of the opening h1. The opening h4 is on the back side of the opening h1. With this, the second ground conductor layer 24 is exposed from the signal transmission line 10 to the outside through the openings h2 to h4. Note that the structures of the openings h5 to h8 are symmetrical to those of the respective openings h1 to h4 with respect to the vertical line. Thus, the description of the openings h5 to h8 is omitted.

The plurality of connection conductor layers 30, 32, 34, 36, 38, 40, 42, and 44 are provided on the upper surface of the insulating base material layer 16b. The plurality of connection conductor layers 30, 32, 34, 36, 38, 40, 42, and 44 have a rectangular shape as viewed in the downward direction. The plurality of connection conductor layers 30 are disposed on the back side of the signal conductor layer 20 as viewed in the downward direction in the second section A12. The plurality of connection conductor layers 30 are arranged in a line at even intervals in the left and right direction. Here, the expression "the plurality of connection conductor layers 30 are disposed on the back side of the signal conductor layer 20 as viewed in the downward direction" refers to the following state. The plurality of connection conductor layers 30 are disposed on the back side of the signal conductor layer 20 as viewed in the downward direction, and as viewed in directions other than the downward direction, the plurality of connection conductor layers 30 may be disposed on the back side of the signal conductor layer 20 but the plurality of connection conductor layers 30 are not necessarily disposed on the back side of the signal conductor layer 20.

The plurality of connection conductor layers 34 are disposed on the front side of the signal conductor layer 20 as viewed in the downward direction in the second section A12. The plurality of connection conductor layers 34 are arranged in a line at even intervals in the left and right direction. The connection conductor layer 38 is disposed on the left side of the left end of the signal conductor layer 20 as viewed in the downward direction in the second section A12. The plurality of connection conductor layers 42 are disposed on the back side of the signal conductor layer 20 as viewed in the downward direction in the first section A11. The plurality of connection conductor layers 42 are arranged in a line at even intervals in the left and right direction. The plurality of connection conductor layers 44 are disposed on the front side of the signal conductor layer 20 as viewed in the downward direction in the first section A11. The plurality of connection conductor layers 44 are arranged in a line at even intervals in the left and right direction. Note that the structures of the plurality of connection conductor layers 32, 36, and 40 are symmetrical to those of the respective plurality of connection conductor layers 30, 34, and 38 with respect to the vertical line. Thus, the description of the plurality of connection conductor layers 32, 36, and 40 is omitted.

The plurality of connection conductor layers 46, 48, 50, 52, 54, 56, 58, and 60 are provided on the upper surface of the insulating base material layer 16c. The plurality of connection conductor layers 46, 48, 50, 52, 54, 56, 58, and 60 have a rectangular shape as viewed in the downward direction. However, the structures of the plurality of connection conductor layers 46, 48, 50, 52, 54, 56, 58, and 60 are the same as the structures of the respective plurality of connection conductor layers 30, 32, 34, 36, 38, 40, 42, and 44, and hence the description thereof is omitted.

The plurality of connection conductor layers 62, 64, 66, 68, 70, 72, 74, and 76 are provided on the lower surface of the insulating base material layer 16d. The plurality of connection conductor layers 62, 64, 66, 68, 70, 72, 74, and 76 have a rectangular shape as viewed in the downward direction. However, the structures of the plurality of connection conductor layers 62, 64, 66, 68, 70, 72, 74, and 76 are the same as the structures of the respective plurality of connection conductor layers 30, 32, 34, 36, 38, 40, 42, and 44, and hence the description thereof is omitted.

The signal conductor layer 20, the first ground conductor layer 22, the second ground conductor layer 24, the outer electrodes 26 and 28, and the plurality of connection conductor layers 30, 32, 34, 36, 38, 40, 42, 44, 46, 48, 50, 52, 54, 56, 58, 60, 62, 64, 66, 68, 70, 72, 74, and 76 as described above are formed by etching copper foil provided on the upper surface or lower surface of the insulating base material layers 16a to 16e, for example.

The plurality of via hole conductors v1 to v8 pass through the insulating base material layers 16b to 16e in the up and down direction. The plurality of via hole conductors v1 to v8 each have a structure in which a via hole conductor passing through the insulating base material layer 16b in the up and down direction, a via hole conductor passing through the insulating base material layer 16c in the up and down direction, and a via hole conductor passing through the insulating base material layer 16d in the up and down direction are connected from top to bottom in this order.

The plurality of via hole conductors v1 are disposed on the back side of the signal conductor layer 20 as viewed in the downward direction in the second section A12. The plurality of via hole conductors v1 are arranged in a line at even intervals in the left and right direction. The plurality of via hole conductors v1 electrically connect the connection conductor layers 30, 46, and 62 to each other. The plurality of via hole conductors v3 are disposed on the front side of the signal conductor layer 20 as viewed in the downward direction in the second section A12. The plurality of via hole conductors v3 are arranged in a line at even intervals in the left and right direction. The plurality of via hole conductors v3 electrically connect the connection conductor layers 34, 50, and 66 to each other. The via hole conductor v5 is disposed on the left side of the left end of the signal conductor layer 20 as viewed in the downward direction in the second section A12. The via hole conductor v5 electrically connects the connection conductor layers 38, 54, and 70 to each other. The structures of the plurality of via hole conductors v2, v4, and v6 are symmetrical to those of the plurality of via hole conductors v1, v3, and v5 with respect to the vertical line. Thus, the description of the plurality of via hole conductors v2, v4, and v6 is omitted.

The plurality of via hole conductors v7 are disposed on the back side of the signal conductor layer 20 as viewed in the downward direction in the first section A11. The plurality of via hole conductors v7 are arranged in a line at even intervals in the left and right direction. The plurality of via hole conductors v7 electrically connect the connection conductor layers 42, 58, and 74 to each other. The plurality of via hole conductors v8 are disposed on the front side of the signal conductor layer 20 as viewed in the downward direction in the first section A11. The plurality of via hole conductors v8 are arranged in a line at even intervals in the left and right direction. The plurality of via hole conductors v8 electrically connect the connection conductor layers 44, 60, and 76 to each other.

The plurality of via hole conductors v9 and v10 pass through the insulating base material layers 16c to 16e in the up and down direction. The plurality of via hole conductors v9 and v10 each have a structure in which a via hole conductor passing through the insulating base material layer 16c in the up and down direction, a via hole conductor passing through the insulating base material layer 16d in the up and down direction, and a via hole conductor passing through the insulating base material layer 16e in the up and down direction are connected from top to bottom in this order.

The via hole conductor v9 is overlapped with the left end portion of the signal conductor layer 20 as viewed in the downward direction in the second section A12. The via hole conductor v9 electrically connects the left end portion of the signal conductor layer 20 and the outer electrode 26 to each other. The via hole conductor v10 is overlapped with the right end portion of the signal conductor layer 20 as viewed in the downward direction in the second section A13. The via hole conductor v10 electrically connects the right end portion of the signal conductor layer 20 and the outer electrode 28 to each other. The via hole conductors v1 to v10 as described above are formed by filling the through holes formed in the insulating base material layers 16b to 16d with a conductive paste containing a metal such as silver and a resin and solidifying the conductive paste by heating, for example.

Here, a first ground region A1, a signal region A2, and a second ground region A3 are described with reference to FIG. 2. The signal transmission line 10 has the signal region A2 including the signal conductor layer 20 and some of the insulating base material layers 16a to 16e, 18a, and 18b, the first ground region A1 including the first ground conductor layer 22 and some of the insulating base material layers 16a to 16e, 18a, and 18b and located above the signal region A2, and the second ground region A3 including the second ground conductor layer 24 and some of the insulating base material layers 16a to 16e, 18a, and 18b and located under the signal region A2. The signal region A2 includes the insulating base material layers 16b to 16d and the signal conductor layer 20. The first ground region A1 includes the insulating base material layers 16a and 18a and the first ground conductor layer 22. The second ground region A3 includes the insulating base material layers 16e and 18b and the second ground conductor layer 24.

The signal region A2 is not fixed to the first ground region A1 in the first section A11 of the base 12. More specifically, the insulating base material layer 16a is not disposed in the first section A11. Thus, in the first section A11, the insulating base material layer 16b included in the signal region A2 is not in contact with the insulating base material layer 16a included in the first ground region A1 and the first ground conductor layer 22 included in the first ground region A1. Then, as illustrated in FIG. 3, a first gap Sp1 is between the signal conductor layer 20 (not illustrated in FIG. 3) and the first ground conductor layer 22 in the up and down direction in the first section A11. In the present preferred embodiment, the first gap Sp1 is between the insulating base material layer 16a and the first ground conductor layer 22 in the up and down direction. In this way, in the present preferred embodiment, the first gap Sp1 is in the base 12 so that the signal region A2 is not fixed to the first ground region A1 in the first section A11 of the base 12.

The plurality of first spacers b7 and b8 are fixed to the signal region A2 and in contact with the first ground region A1 without being fixed thereto. The plurality of first spacers b7 and b8 are disposed in the first section A11. The plurality of first spacers b7 and b8 are disposed inside the first gap Sp1. The plurality of first spacers b7 are disposed on the back side of the signal conductor layer 20 as viewed in the downward direction in the first section A11. The plurality of first spacers b7 are arranged in a line at even intervals in the left and right direction. The plurality of first spacers b7 protrude upward from the plurality of connection conductor layers 42. The plurality of first spacers b7 are fixed to the plurality of connection conductor layers 42. The plurality of connection conductor layers 42 are fixed to the insulating base material layer 16b. Thus, the plurality of first spacers b7 are fixed to the signal region A2. The plurality of first spacers b7 and b8 are solder bumps, for example.

As described above, the plurality of first spacers b7 protrude upward from the plurality of connection conductor layers 42. Moreover, the plurality of first spacers b7 are overlapped with the first ground conductor layer 22 as viewed in the downward direction. With this, the plurality of first spacers b7 are in contact with the first ground conductor layer 22 without being fixed thereto. Thus, the plurality of first spacers b7 can be smoothly displaced in the front and back direction and left and right direction relative to the first ground conductor layer 22 when the first section A11 is deformed. With this, the plurality of first spacers b7 are in contact with the first ground region A1 without being fixed thereto.

The plurality of first spacers b8 are disposed on the front side of the signal conductor layer 20 as viewed in the downward direction in the first section A11. The plurality of first spacers b8 are arranged in a line at even intervals in the left and right direction. The plurality of first spacers b8 are formed on the plurality of connection conductor layers 44.

The structure of the plurality of first spacers b8 is the same as that of the plurality of first spacers b7, and hence the description thereof is omitted.

The signal transmission line 10 can prevent a change in characteristic impedance of the signal transmission line 10, even when the base 12 is bent in the up and down direction. Now, a case where the signal transmission line 10 is bent upward is described as an example. In the signal transmission line 10, when the first section A11 is bent upward, compressive stress is generated in the first ground region A1 in the first section A11. When the first ground region A1 is fixed to the signal region A2, the compressive stress is not distributed over the entire first ground region A1 but concentrated on a portion of the first ground region A1. In this case, the first ground region A1 is deformed to be bent in part. As a result, the characteristic impedance of the signal transmission line 10 is changed.

Thus, in the signal transmission line 10, the signal region A2 is not fixed to the first ground region A1. Moreover, the plurality of first spacers b7 and b8 are fixed to the signal region A2 and in contact with the first ground region A1 without being fixed thereto. With this, the concentration of compressive stress on a portion of the first ground region A1 is prevented to prevent the first ground region A1 from being deformed to be bent in part. More specifically, the signal region A2 is not fixed to the first ground region A1. Thus, when the first section A11 is bent upward, the first ground region A1 can be shifted in the front and back direction and left and right direction relative to the signal region A2. Moreover, the plurality of first spacers b7 and b8 are fixed to the signal region A2 and in contact with the first ground region A1 without being fixed thereto. With this, the plurality of first spacers b7 and b8 can be smoothly displaced in the front and back direction and left and right direction relative to the first ground region A1 when the first section A11 is deformed. Thus, the plurality of first spacers b7 and b8 do not prevent the first ground region A1 from being shifted in the front and back direction and left and right direction relative to the signal region A2. Thus, the concentration of compressive stress on a portion of the first ground region A1 is prevented to prevent the first ground region A1 from being deformed to be bent in part. As a result, the signal transmission line 10 can prevent, even when the base 12 is bent upward, a change in characteristic impedance of the signal transmission line 10.

Moreover, the plurality of first spacers b7 and b8 are fixed to the signal region A2 and in contact with the first ground region A1 without being fixed thereto. With this, a change in interval between the signal conductor layer 20 and the first ground conductor layer 22 in the up and down direction is prevented. As a result, the signal transmission line 10 can prevent, even when the base 12 is bent upward, a change in characteristic impedance of the signal transmission line 10.

Further, in the signal transmission line 10, the first section A11 is easily bent in the up and down direction. More specifically, in the signal transmission line 10, large compressive stress is generated in the first ground region A1 in the first section A11 when the first section A11 is bent upward. Thus, when the first ground region A1 is fixed to the signal region A2, the compressive stress is concentrated on a portion of the first ground region A1. In this case, the first ground region A1 is deformed to be bent in part. Such deformation prevents the uniform application of compressive stress to the first ground region A1, to thereby prevent the first ground region A1 from being smoothly deformed without being bent. Thus, the signal region A2 is not fixed to the first ground region A1 in the first section A11 of the base 12. With this, in the signal transmission line 10, the first section A11 is easily bent in the up and down direction.

Further, in the signal transmission line 10, also for the following reasons, the first section A11 is easily bent in the up and down direction. More specifically, in the signal transmission line 10, the first gap Sp1 is between the signal conductor layer 20 and the first ground conductor layer 22 in the up and down direction. With this, the first section A11 is bent when the first gap Sp1 is deformed.

Further, in the signal transmission line 10, the occurrence of dielectric loss is prevented. More specifically, in the signal transmission line 10, the first gap Sp1 is in the first section A11 of the base 12. With this, the first gap Sp1 is around the signal conductor layer 20 in the first section A11. Thus, the dielectric constant around the signal transmission line 10 decreases. As a result, the occurrence of dielectric loss is prevented in the signal transmission line 10.

Further, in the signal transmission line 10, the first ground conductor layer 22 can be more positively connected to the ground potential. The plurality of first spacers b7 and b8 are in contact with the first ground conductor layer 22. With this, the first ground conductor layer 22 can be connected to the ground potential with the plurality of first spacers b7 and b8 interposed therebetween.

Further, the plurality of first spacers b7 are overlapped with the first ground conductor layer 22 as viewed in the downward direction. With this, a change in interval between the signal conductor layer 20 and the first ground conductor layer 22 in the up and down direction is prevented. As a result, the signal transmission line 10 can prevent a change in characteristic impedance of the signal transmission line 10, even when the base 12 is bent in the up and down direction.

The signal region A2 is not fixed to the second ground region A3 in the first section A11 of the base 12. More specifically, the insulating base material layer 16e is not disposed in the first section A11. Thus, in the first section A11, the insulating base material layer 16d included in the signal region A2 is not in contact with the insulating base material layer 16e included in the second ground region A3 and the second ground conductor layer 24 included in the second ground region A3. Then, as illustrated in FIG. 3, a gap Sp3 is between the signal conductor layer 20 (not illustrated in FIG. 3) and the second ground conductor layer 24 in the up and down direction. In the present preferred embodiment, the gap Sp3 is between the insulating base material layer 16d and the second ground conductor layer 24 in the up and down direction. In this way, in the present preferred embodiment, the gap Sp3 is in the base 12 so that the signal region A2 is not fixed to the second ground region A3 in the first section A11 of the base 12.

The plurality of third spacers b17 and b18 are fixed to the signal region A2 and in contact with the second ground region A3 without being fixed thereto. The plurality of third spacers b17 and b18 are disposed in the first section A11. The plurality of third spacers b17 and b18 are disposed inside the gap Sp3. The plurality of third spacers b17 and b18 are solder bumps, for example. However, the structures of the third spacers b17 and b18 are symmetrical to those of the first spacers b7 and b8 with respect to the horizontal line. Thus, the description of the third spacers b17 and b18 is omitted.

The plurality of second spacers b1 to b6 are fixed to the signal region A2 and the first ground region A1. The plurality of second spacers b1, b3, and b5 are disposed in the second section A12. The plurality of second spacers b2, b4, and b6 are disposed in the second section A13. The plurality of second spacers b1 are disposed on the back side of the signal conductor layer 20 as viewed in the downward direction in the second section A12. The plurality of second spacers b1 are arranged in a line at even intervals in the left and right direction. The plurality of second spacers b1 protrude upward from the plurality of connection conductor layers 30. The plurality of second spacers b1 are fixed to the plurality of connection conductor layers 30. The plurality of connection conductor layers 30 are fixed to the insulating base material layer 16b. Thus, the plurality of second spacers b1 are fixed to the signal region A2. The plurality of second spacers b1 to b6 are solder bumps, for example.

As described above, the plurality of second spacers b1 protrude upward from the plurality of connection conductor layers 30. Then, the plurality of second spacers b1 pass through the through holes formed in the insulating base material layer 16a in the up and down direction. With this, the plurality of second spacers b1 are fixed to the insulating base material layer 16a. Moreover, the plurality of second spacers b1 are overlapped with the first ground conductor layer 22 as viewed in the downward direction. Then, the upper ends of the plurality of second spacers b1 are fixed to the first ground conductor layer 22. Thus, even when the first section A11 is deformed, the plurality of second spacers b1 cannot be smoothly displaced in the front and back direction and left and right direction relative to the first ground conductor layer 22. With this, the plurality of second spacers b1 are fixed to the first ground region A1.

In the signal transmission line 10, the second section A12 is difficult to bend in the up and down direction. More specifically, the plurality of second spacers b1 are fixed to the signal region A2 and the first ground region A1 in the second section A12. With this, the second spacers b1 block the first ground region A1 from being displaced in the front and back direction and left and right direction relative to the signal region A2 in the second section A12. As a result, in the signal transmission line 10, the second section A12 is difficult to bend in the up and down direction. The second section A12 is provided with a connector or a circuit, for example. Thus, with the second section A12 that is difficult to bend, the reliability of the connection between the connector and the second section A12 is enhanced. Further, with the second section A12 that is difficult to bend, the circuit is not easily deformed and a change in electrical characteristics of the circuit is thus prevented.

In particular, the plurality of second spacers b1 are fixed to the first ground conductor layer 22. Then, the second spacers b1 are solder bumps. Thus, the plurality of second spacers b1 tend to be strongly fixed to the first ground conductor layer 22. Thus, in the signal transmission line 10, the second section A12 is more difficult to bend in the up and down direction.

Further, the first spacers b7 and b8 and the second spacers b1 to b6 may all be solder bumps. In this case, the first spacers b7 and b8 and the second spacers b1 to b6 can be formed at the same time so that the number of manufacturing processes can be reduced.

The plurality of second spacers b3 are disposed on the front side of the signal conductor layer 20 as viewed in the downward direction in the second section A12. The plurality of second spacers b3 are arranged in a line at even intervals in the left and right direction. The plurality of second spacers b3 are formed on the plurality of connection conductor layers 34. The structure of the plurality of second spacers b3 is the same as that of the plurality of second spacers b1, and hence the description thereof is omitted.

The second spacer b5 is disposed on the left of the left end of the signal conductor layer 20 as viewed in the downward direction in the first section A11. The second spacer b5 is formed on the connection conductor layer 38. The structure of the second spacer b5 is the same as that of the plurality of second spacers b1, and hence the description thereof is omitted.

The plurality of fourth spacers b11 to b16 are fixed to the signal region A2 and the second ground region A3. The plurality of fourth spacers b11, b13, and b15 are disposed in the second section A12. The plurality of fourth spacers b12, b14, and b16 are disposed in the second section A13. The structures of the plurality of fourth spacers b11 to b16 are symmetrical to those of the plurality of second spacers b1 to b6 with respect to the horizontal line. Thus, the description of the plurality of fourth spacers b11 to b16 is omitted.

The Young's modulus of the material of the plurality of second spacers b1 to b6, the Young's modulus of the material of the plurality of first spacers b7 and b8, the Young's modulus of the material of the plurality of fourth spacers b11 to b16, and the Young's modulus of the material of the plurality of third spacers b17 and b18 as described above are higher than the Young's modulus of the material of the base 12. The plurality of second spacers b1 to b6, the plurality of first spacers b7 and b8, the plurality of fourth spacers b11 to b16, and the plurality of third spacers b17 and b18 are higher in rigidity than the base 12. Thus, the plurality of second spacers b1 to b6 and the plurality of first spacers b7 and b8 maintain the interval between the signal conductor layer 20 and the first ground conductor layer 22 in the up and down direction. The plurality of fourth spacers b11 to b16 and the plurality of third spacers b17 and b18 maintain the interval between the signal conductor layer 20 and the second ground conductor layer 24 in the up and down direction. The material of the plurality of second spacers b1 to b6, the plurality of first spacers b7 and b8, the plurality of fourth spacers b11 to b16, and the plurality of third spacers b17 and b18 is solder (an alloy of lead and tin), for example.

The signal transmission line 10 as described above is bent in use in the electronic device. For example, as illustrated in FIG. 3, the first section A11 is bent with the upper surface of the base 12 folded using a mountain fold and bent with the upper surface of the base 12 folded using a valley fold. In the signal transmission line 10, when the first section A11 is bent as described above, a change in characteristic impedance of the signal transmission line 10 is more effectively prevented. More specifically, with the upper surface of the base 12 folded using a valley fold, compressive stress is generated in the insulating base material layers 16a and 18a. With the upper surface of the base 12 folded using a mountain fold, tensile stress is generated in the insulating base material layers 16a and 18a. However, the signal region A2 is not fixed to the first ground region A1 in the first section A11 of the base 12. Thus, in the first section A11 of the base 12, compressive stress that is generated in the insulating base material layers 16a and 18a and tensile stress that is generated in the insulating base material layers 16a and 18a cancel each other out. As a result, a deformation in which the insulating base material layers 16a and 18a are bent in part hardly occurs in the first section A11 of the base 12. For the same reason, a deformation in which the insulating base material layers 16d and 18b are bent in part hardly occurs in the first section A11 of the base 12. As a result, a change in interval between the signal conductor layer 20 and the first ground conductor layer 22 in the up and down direction and a change in interval between the signal conductor layer 20 and the second ground conductor layer 24 in the up and down direction are prevented. A change in capacitance value between the signal conductor layer 20 and the first ground conductor layer 22 and a change in capacitance value between the signal conductor layer 20 and the second ground conductor layer 24 are prevented. From the above, in the signal transmission line 10, a change in characteristic impedance of the signal transmission line 10 is more effectively prevented.

Method of Manufacturing Signal Transmission Line

Now, a non-limiting example of a method of manufacturing the signal transmission line 10 is described with reference to the drawings. FIGS. 4A to 4C to FIGS. 6A and 6B are sectional views of the manufacturing processes of the signal transmission line 10.

First, as illustrated in FIG. 2, the signal conductor layer 20, the first ground conductor layer 22, the second ground conductor layer 24, the outer electrodes 26 and 28, the plurality of via hole conductors v1 to v10, and the plurality of connection conductor layers 30, 32, 34, 36, 38, 40, 42, 44, 46, 48, 50, 52, 54, 56, 58, 60, 62, 64, 66, 68, 70, 72, 74, and 76 are formed on the insulating base material layers 16a to 16e. This process is a general process and the description thereof is thus omitted.

Next, as illustrated in FIG. 4A, the insulating base material layers 16b to 16d are stacked from top to bottom in this order. Then, as illustrated in FIG. 4B, the insulating base material layers 16b to 16d are subjected to thermocompression bonding. With this, the insulating base material layers 16b to 16d are integrated. As a result, the signal region A2 is formed.

Next, as illustrated in FIG. 4C, the plurality of second spacers b1 to b6, the plurality of first spacers b7 and b8, the plurality of fourth spacers b11 to b16, and the plurality of third spacers b17 and b18 are formed on the plurality of connection conductor layers 30, 32, 34, 36, 38, 40, 42, 44, 62, 64, 66, 68, 70, 72, 74, and 76.

Next, as illustrated in FIG. 5A and FIG. 6A, the first ground region A1 is disposed above the signal region A2 and the second ground region A3 is disposed under the signal region A2. Then, as illustrated in FIG. 5B and FIG. 6B, the first ground region A1, the signal region A2, and the second ground region A3 are subjected to thermocompression bonding. At this time, as illustrated in FIG. 5B, the second spacers b1 to b6 are inserted into the through holes formed in the insulating base material layer 16a. The fourth spacers b11 to b16 are inserted into the through holes formed in the insulating base material layer 16e. Then, by thermocompression bonding, the second spacers b1 to b6 are fixed to the insulating base material layer 16a and the first ground conductor layer 22. By thermocompression bonding, the fourth spacers b11 to b16 are fixed to the insulating base material layer 16e and the second ground conductor layer 24. However, the first spacers b7 and b8 are not fixed to the first ground conductor layer 22. The third spacers b17 and b18 are not fixed to the second ground conductor layer 24. Through the processes described above, the signal transmission line 10 is completed.

Since the through holes are used, the first spacers b7 and b8 and the second spacers b1 to b6 are easily positioned.

First Modification

Structure of Signal Transmission Line

Figure 8:
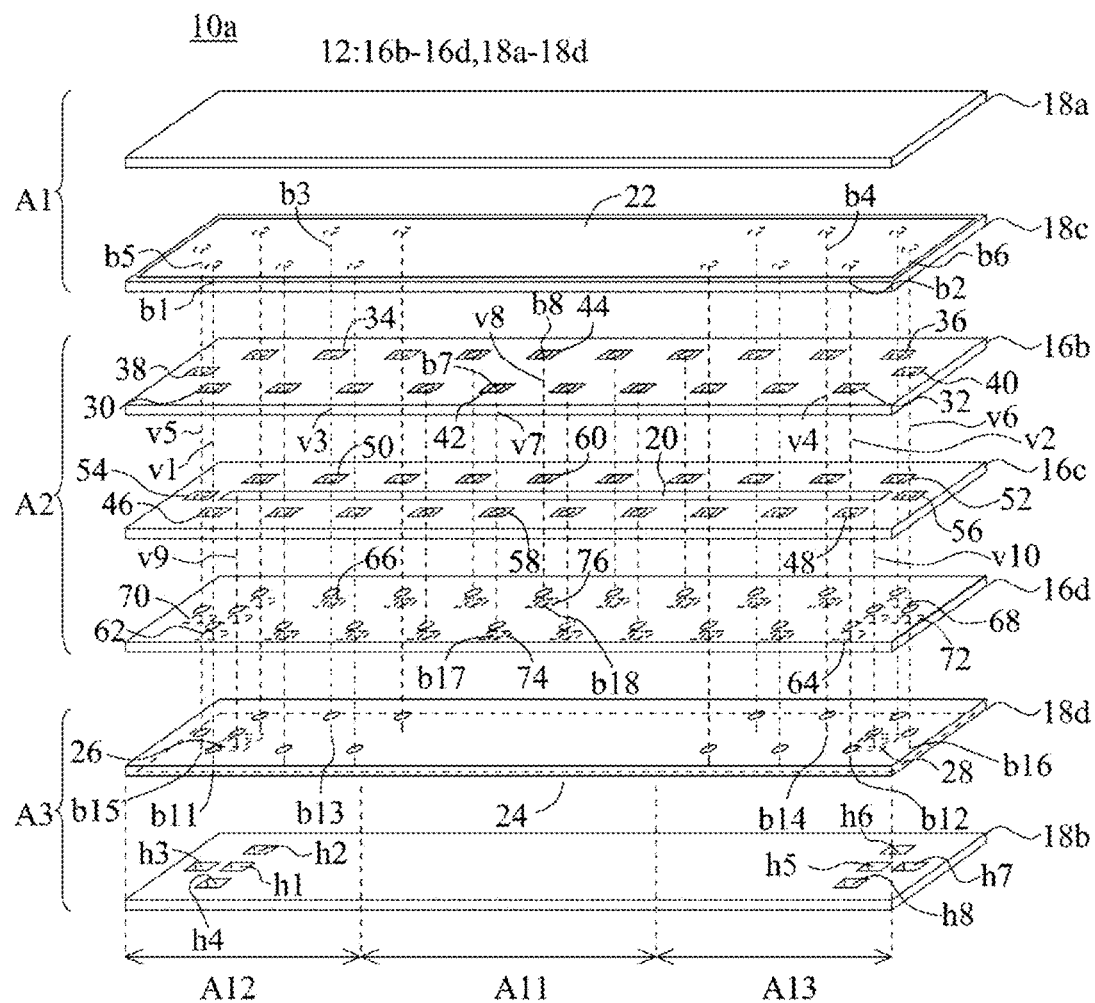

Now, the structure of a signal transmission line 10a according to a first modification is described with reference to the drawings. FIG. 7 is a sectional view taken along the line A-A of FIG. 1. FIG. 8 is an exploded perspective view of the signal transmission line 10a. FIG. 1 is referred to with regard to the external perspective view of the signal transmission line 10a.

As illustrated in FIG. 7 and FIG. 8, the signal transmission line 10a is different from the signal transmission line 10 in that a second gap Sp2 is formed between the signal conductor layer 20 and the first ground conductor layer 22 in the up and down direction in the second section A12. In the present preferred embodiment, the second gap Sp2 is formed between an insulating base material layer 18c and the insulating base material layer 16b in the up and down direction. The second gap Sp2 is formed in the base 12 so that the signal region A2 is not in contact with the first ground region A1 in the second section A12 of the base 12. Further, a gap Sp4 is formed between the signal conductor layer 20 and the second ground conductor layer 24 in the up and down direction in the second section A12. In the present preferred embodiment, the gap Sp4 is formed between an insulating base material layer 18d and the insulating base material layer 16d in the up and down direction. The gap Sp4 is formed in the base 12 so that the signal region A2 is not in contact with the second ground region A3 in the second section A12 of the base 12. Now, the signal transmission line 10a is described mainly in terms of such differences.

As illustrated in FIG. 8, the base 12 has a structure in which the plurality of insulating base material layers 16b to 16d and 18a to 18d are laminated in the up and down direction. The insulating base material layers 18a, 18c, 16b to 16d, 18d, and 18b are laminated from top to bottom in this order. The insulating base material layers 18c and 18d are resist layers. The insulating base material layers 18c and 18d have the same shape as the base 12 as viewed in the downward direction.

The first gap Sp1 is between the insulating base material layer 18c and the insulating base material layer 16b in the first section A11. The first spacers b7 and b8 pass through the first gap Sp1 in the up and down direction. The first spacers b7 and b8 are in contact with the lower surface of the insulating base material layer 18c without being fixed thereto. With this, the plurality of first spacers b7 and b8 are fixed to the signal region A2 and in contact with the first ground region A1 without being fixed thereto. Note that the structures of the third spacers b17 and b18 are symmetrical to those of the first spacers b7 and b8 with respect to the horizontal line. Thus, the description of the third spacers b17 and b18 is omitted.

The second gap Sp2 is between the insulating base material layer 18c and the insulating base material layer 16b in the second section A12. The plurality of second spacers b1, b3, and b5 pass through the second gap Sp2 in the up and down direction. The plurality of second spacers b1, b3, and b5 pass through the through holes formed in the insulating base material layer 18c in the up and down direction. With this, the plurality of second spacers b1, b3, and b5 are fixed to the insulating base material layer 18c. Moreover, the upper ends of the plurality of second spacers b1, b3, and b5 are fixed to the first ground conductor layer 22. With this, the plurality of second spacers b1, b3, and b5 are fixed to the first ground region A1 and the signal region A2. Note that the structures of the second spacers b2, b4, and b6 are symmetrical to those of the second spacers b1, b3, and b5 with respect to the vertical line. Thus, the description of the second spacers b1, b3, and b5 is omitted. Further, the structures of the fourth spacers b11 to b16 are symmetrical to those of the second spacers b1 to b6 with respect to the horizontal line. Thus, the description of the fourth spacers b11 to b16 is omitted.

In the signal transmission line 10a, the occurrence of dielectric loss is prevented. More specifically, in the signal transmission line 10a, the second gap Sp2 is in the second section A12 of the base 12. With this, the second gap Sp2 extends around the signal conductor layer 20 in the second section A12. Thus, the dielectric constant around the signal transmission line 10a decreases. As a result, the occurrence of dielectric loss is prevented in the signal transmission line 10a.

Method of Manufacturing Signal Transmission Line

Now, a non-limiting example of a method of manufacturing the signal transmission line 10a is described with reference to the drawings. FIGS. 9A to 9C to FIGS. 11A and 11B are sectional views of the manufacturing processes of the signal transmission line 10a.

First, as illustrated in FIG. 8, the signal conductor layer 20, the first ground conductor layer 22, the second ground conductor layer 24, the outer electrodes 26 and 28, the plurality of via hole conductors v1 to v10, and the plurality of connection conductor layers 30, 32, 34, 36, 38, 40, 42, 44, 46, 48, 50, 52, 54, 56, 58, 60, 62, 64, 66, 68, 70, 72, 74, and 76 are formed on the insulating base material layers 16b to 16d and 18a to 18d. This process is a general process and the description thereof is thus omitted.

Next, as illustrated in FIG. 9A, the insulating base material layers 16b to 16d are stacked from top to bottom in this order. Then, as illustrated in FIG. 9B, the insulating base material layers 16b to 16d are subjected to thermocompression bonding. With this, the insulating base material layers 16b to 16d are integrated. With this, the signal region A2 is formed.

Next, as illustrated in FIG. 9C, the plurality of second spacers b1 to b6, the plurality of first spacers b7 and b8, the plurality of fourth spacers b11 to b16, and the plurality of third spacers b17 and b18 are formed on the plurality of connection conductor layers 30, 32, 34, 36, 38, 40, 42, 44, 62, 64, 66, 68, 70, 72, 74, and 76. The second spacers b1 to b6, the plurality of first spacers b7 and b8, the plurality of fourth spacers b11 to b16, and the plurality of third spacers b17 and b18 of the signal transmission line 10a are longer than the second spacers b1 to b6, the plurality of first spacers b7 and b8, the plurality of fourth spacers b11 to b16, and the plurality of third spacers b17 and b18 of the signal transmission line 10.

Figure 10A:
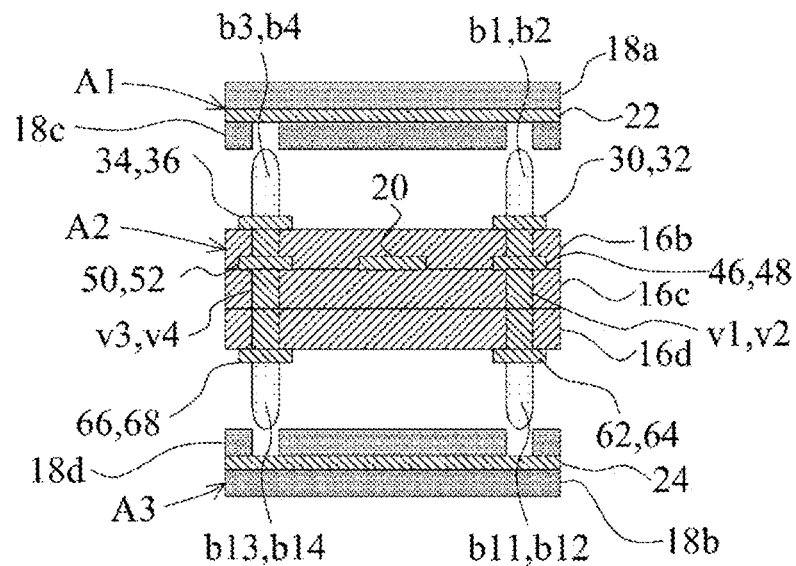
Figure 10B:
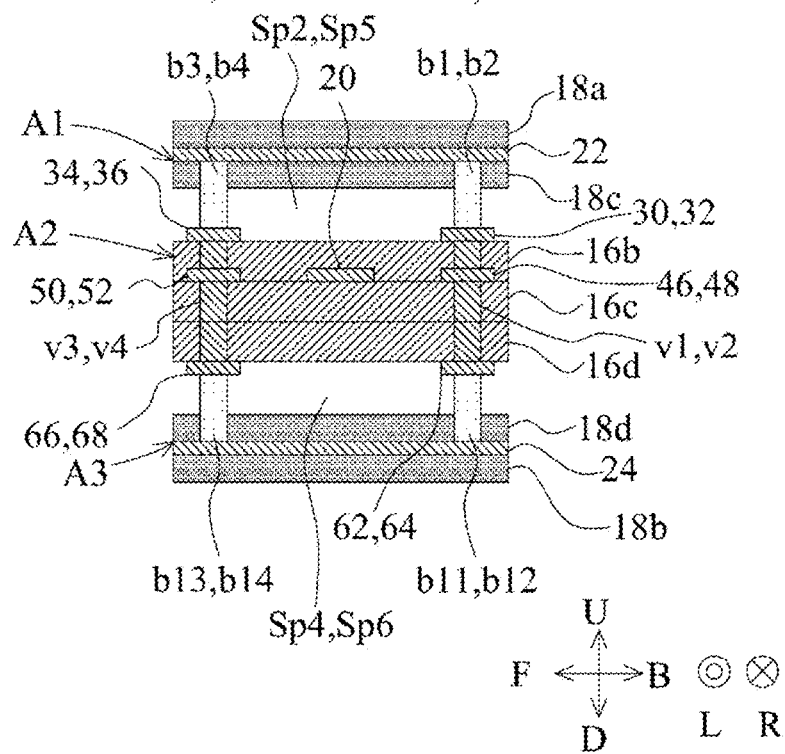

Next, as illustrated in FIG. 10A and FIG. 11A, the first ground region A1 is disposed above the signal region A2 and the second ground region A3 is disposed under the signal region A2. Then, as illustrated in FIG. 10B and FIG. 11B, the first ground region A1, the signal region A2, and the second ground region A3 are subjected to thermocompression bonding. At this time, as illustrated in FIG. 10B, the second spacers b1 to b6 are inserted into the through holes formed in the insulating base material layer 18c. The fourth spacers b11 to b16 are inserted into the through holes formed in the insulating base material layer 18d. Then, by thermocompression bonding, the second spacers b1 to b6 are fixed to the insulating base material layer 18c and the first ground conductor layer 22. By thermocompression bonding, the fourth spacers b11 to b16 are fixed to the insulating base material layer 18d and the second ground conductor layer 24. However, the first spacers b7 and b8 are not fixed to the first ground conductor layer 22. The third spacers b17 and b18 are not fixed to the second ground conductor layer 24. Further, the first gap Sp1, the second gap Sp2, and a gap Spy are formed between the first ground region A1 and the signal region A2. Gaps Sp3, Sp4, and Sp6 are formed between the second ground region A3 and the signal region A2. Through the processes described above, the signal transmission line 10a is completed.

Second Modification

Figure 12:
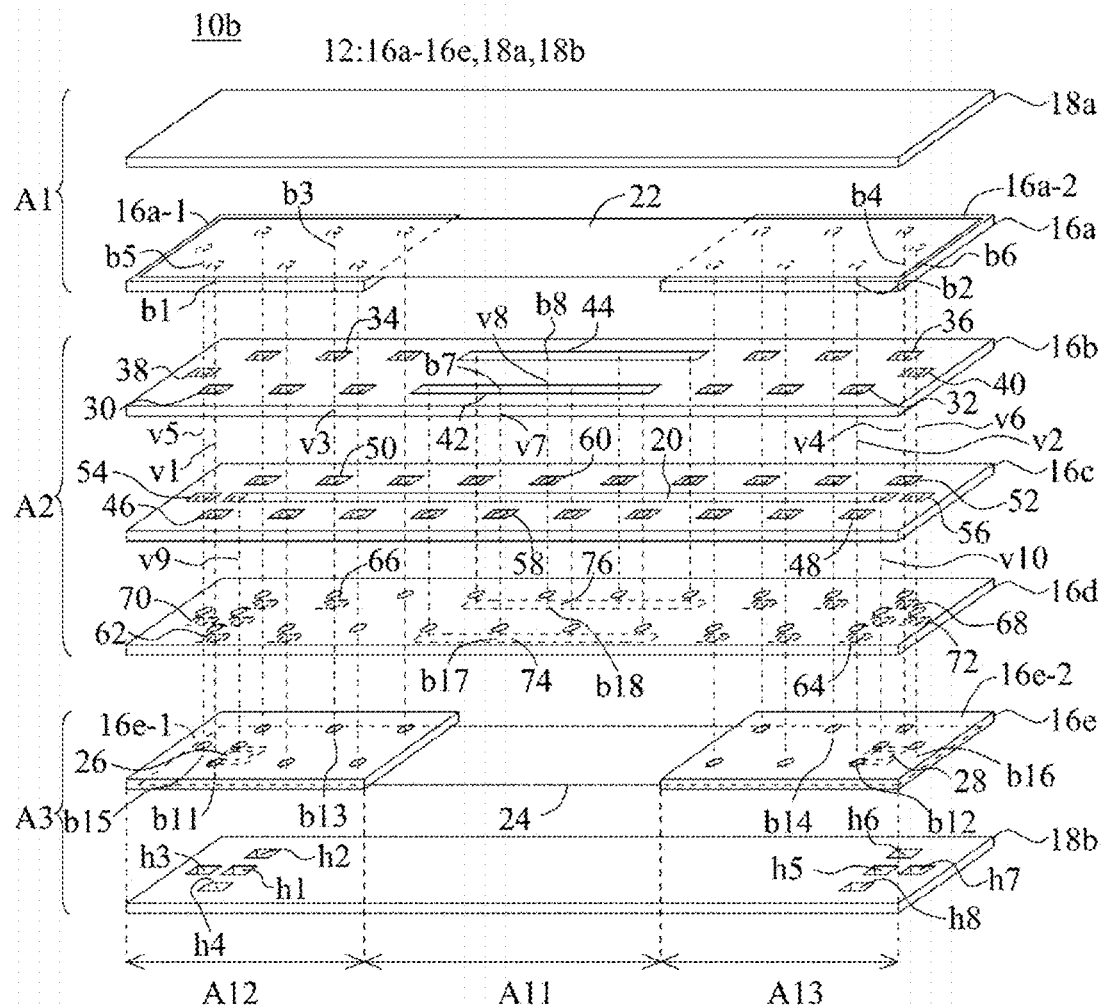
FIG. 12 is an exploded perspective view of the signal transmission line 10b.

Now, the structure of a signal transmission line 10b according to a second modification is described with reference to the drawings. FIG. 12 is an exploded perspective view of the signal transmission line 10b. FIG. 13 is a sectional view taken along the line A-A of FIG. 1. FIG. 1 is referred to with regard to the external perspective view of the signal transmission line 10b.

The signal transmission line 10b is different from the signal transmission line 10 in structures of the first spacers b7 and b8, the third spacers b17 and b18, and the connection conductor layers 42, 44, 74, and 76. Now, the signal transmission line 10b is described in terms mainly of such differences.

The first spacers b7 and b8 of the signal transmission line 10b each have a structure obtained by connecting corresponding ones of the plurality of first spacers b7 and b8 of the signal transmission line 10 into one. With this, the first spacers b7 and b8 each have a linear shape extending in the left and right direction as viewed in the downward direction. The third spacers b17 and b18 of the signal transmission line 10b each have a structure obtained by connecting corresponding ones of the plurality of third spacers b17 and b18 of the signal transmission line 10 into one. With this, the third spacers b17 and b18 each have a linear shape extending in the left and right direction.

Further, the connection conductor layers 42, 44, 74, and of the signal transmission line 10b each have a structure obtained by connecting corresponding ones of the plurality of connection conductor layers 42, 44, 74, and 76 of the signal transmission line 10 into one. With this, the connection conductor layers 42, 44, 74, and 76 of the signal transmission line 10b each have a linear shape extending in the left and right direction as viewed in the downward direction.

With the signal transmission line 10b, the first section A11 is easily kept bent. More specifically, the first spacers b7 and b8 extend in the left and right direction in the first section A11. With this, when the first section A11 is bent, the first spacers b7 and b8 are plastically deformed. As a result, the first spacers b7 and b8 keep the first section A11 bent.

Other Preferred Embodiments

The signal transmission lines according to preferred embodiments of the present invention are not limited to the signal transmission lines 10, 10a, and 10b and can be modified within the scope of the gist of the present invention. Further, the configurations of the signal transmission lines 10, 10a, and 10b can be combined.

Note that, in the signal transmission lines 10, 10a, and 10b, the one or more first spacers b7 and b8 may be in contact with the signal region A2 without being fixed thereto and fixed to the first ground region A1. Further, the one or more third spacers b17 and b18 may be in contact with the signal region A2 without being fixed thereto and fixed to the second ground region A3.

Note that, in the signal transmission lines 10, 10a, and 10b, the second ground conductor layer 24 is not essential.

Note that, in the signal transmission lines 10, 10a, and 10b, the first gap Sp1 is not essential. The signal region A2 is not necessarily in contact with and fixed to the first ground region A1 in the first section A11 of the base 12. The gap Sp3 is not essential. The signal region A2 is not necessarily in contact with and fixed to the second ground region A3 in the first section A11 of the base 12.

Note that, in the signal transmission lines 10, 10a, and 10b, the numbers of the plurality of second spacers b1 to b6, the plurality of first spacers b7 and b8, the plurality of fourth spacers b11 to b16, and the plurality of third spacers b17 and b18 are not limited to the exemplified ones. It is only necessary that the signal transmission line 10, 10a, or 10b includes the one or more second spacers b1 to b6, the one or more first spacers b7 and b8, the one or more fourth spacers b11 to b16, and the one or more third spacers b17 and b18.

Note that, in the signal transmission lines 10, 10a, and 10b, the second spacers b1 to b6, the first spacers b7 and b8, the fourth spacers b11 to b16, and the third spacers b17 and b18 may be realized by components other than solder bumps.

Note that, in the signal transmission lines 10, 10a, and 10b, the first spacers b7 and b8 are not necessarily overlapped with the first ground conductor layer 22 as viewed in the downward direction. The third spacers b17 and b18 are not necessarily overlapped with the second ground conductor layer 24 as viewed in the downward direction.

Note that the extending direction of the signal transmission lines 10, 10a, and 10b may be the front and back direction or a diagonal direction instead of the left and right direction. In a case where the extending direction of the signal transmission lines 10, 10a, and 10b is the front and back direction, the signal transmission lines 10, 10a, and 10b are easily bent in the up and down direction.

Note that, in FIG. 12, the second spacers b1 to b6 are arranged in two lines in the left and right direction. However, the second spacers b1 to b6 may be arranged in three or more lines in the left and right direction. Further, the second spacers b1 to b6 may be arranged in a staggered manner.

Note that it is only necessary that the second sections A12 and A13 have a radius of curvature larger than the radius of curvature of the first section A11. Thus, the second sections A12 and A13 may be bent in the up and down direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission line comprising:
    a base including a plurality of insulating base material layers laminated in an up and down direction and a first section that is bent in the up and down direction;
    a signal conductor layer in the base;
    a first ground conductor layer in the base and above the signal conductor layer so as to be overlapped with the signal conductor layer as viewed in a downward direction; and
    one or more first spacers; wherein
    the signal transmission line further comprises:
        a signal region that includes the signal conductor layer and some of the plurality of insulating base material layers; and
        a first ground region that includes the first ground conductor layer and some of the plurality of insulating base material layers and is located above the signal region;
    the signal region is not fixed to the first ground region in the first section of the base;
    the one or more first spacers are fixed to the signal region and in contact with the first ground region without being fixed thereto, or are in contact with the signal region without being fixed thereto and fixed to the first ground region; and
    the one or more first spacers are in the first section.

2. The signal transmission line according to claim 1, wherein
    the base includes a second section that has a radius of curvature larger than a radius of curvature of the first section;
    the signal transmission line further includes one or more second spacers;
    the one or more second spacers are fixed to the signal region and the first ground region; and
    the one or more second spacers are in the second section.

3. The signal transmission line according to claim 2, further comprising one or more third spacers and one or more fourth spacers.

4. The signal transmission line according to claim 3, wherein the one or more third spacers are in contact with the signal region without being fixed thereto and fixed to a ground region.

5. The signal transmission line according to claim 3, wherein the one or more third spacers are overlapped with a second ground conductor layer as viewed in the downward direction.

6. The signal transmission line according to claim 2, wherein the one or more second spacers are fixed to the first ground conductor layer.

7. The signal transmission line according to claim 2, wherein
    a second gap is located between the signal conductor layer and the first ground conductor layer in the up and down direction in the second section; and
    the second gap is located in the base so that the signal region is not fixed to the first ground region in the second section.

8. The signal transmission line according to claim 2, wherein the second spacer includes a solder bump.

9. The signal transmission line according to claim 2, wherein the second section is bent in the up and down direction.

10. The signal transmission line according to claim 1, wherein the one or more first spacers are fixed to the signal region and in contact with the first ground region without being fixed thereto.

11. The signal transmission line according to claim 10, wherein the one or more first spacers are in contact with the first ground conductor layer.

12. The signal transmission line according to claim 1, wherein a Young's modulus of a material of the one or more first spacers is higher than a Young's modulus of a material of the base.

13. The signal transmission line according to claim 1, wherein the first spacer includes a solder bump.

14. The signal transmission line according to claim 1, further comprising a plurality of the first spacers.

15. The signal transmission line according to claim 1, wherein
    a first gap is located between the signal conductor layer and the first ground conductor layer in the up and down direction in the first section;
    the signal region is not fixed to the first ground region in the first section; and
    the one or more first spacers are inside the first gap.

16. The signal transmission line according to claim 1, wherein the base is flexible.

17. The signal transmission line according to claim 1, wherein the first section is bent with an upper surface of the base folded with a mountain fold and bent with the upper surface of the base folded with a valley fold.

18. The signal transmission line according to claim 1, wherein the one or more first spacers are overlapped with the first ground conductor layer as viewed in the downward direction.

19. An electronic device comprising:
at least two circuit boards; and
the signal transmission line according to claim 1 connecting the at least two circuit boards.

20. A mobile phone comprising:
at least two circuit boards; and
the signal transmission line according to claim 1 connecting the at least two circuit boards.

* * * * *